United States Patent
Kantor et al.

(10) Patent No.: US 7,646,254 B2
(45) Date of Patent: Jan. 12, 2010

(54) RADIATION HARD OSCILLATOR AND DIFFERENTIAL CIRCUIT DESIGN

(75) Inventors: Bradley A. Kantor, Plymouth, MN (US); Jeffrey J. Kriz, Eden Prairie, MN (US)

(73) Assignee: Honeywell International Inc., Morristown, NJ (US)

( * ) Notice: Subject to any disclaimer, the term of this patent is extended or adjusted under 35 U.S.C. 154(b) by 126 days.

(21) Appl. No.: 11/847,517

(22) Filed: Aug. 30, 2007

(65) Prior Publication Data
US 2009/0058538 A1    Mar. 5, 2009

(51) Int. Cl.
*H03L 7/00* (2006.01)
(52) U.S. Cl. .................. 331/2; 331/46; 331/49; 331/45; 331/175; 331/74
(58) Field of Classification Search ............... 331/2, 331/46, 45, 49, 74, 175
See application file for complete search history.

(56) References Cited

U.S. PATENT DOCUMENTS

| | | | |
|---|---|---|---|
| 5,798,623 A | 8/1998 | El-Sadi | 312/254 |
| 6,121,849 A | 9/2000 | McCollough et al. | 331/175 |
| 6,285,865 B1 | 9/2001 | Vorenkamp et al. | 455/307 |
| 6,377,315 B1 | 4/2002 | Carr et al. | 348/726 |
| 6,404,293 B1 | 6/2002 | Darabi et al. | 331/37 |
| 6,417,737 B1 | 7/2002 | Moloudi et al. | 330/301 |
| 6,426,680 B1 | 7/2002 | Duncan et al. | 331/34 |
| 6,445,039 B1 | 9/2002 | Woo et al. | 257/355 |
| 6,448,862 B1 | 9/2002 | Yoder et al. | 331/57 |
| 6,504,420 B1 | 1/2003 | Vorenkamp et al. | 327/513 |
| 6,509,796 B2 | 1/2003 | Nguyen et al. | 330/254 |
| 6,525,609 B1 | 2/2003 | Behzad | 330/254 |
| 6,549,766 B2 | 4/2003 | Vorenkamp et al. | 455/307 |
| 6,591,091 B1 | 7/2003 | Vorenkamp et al. | 455/179.1 |
| 6,608,527 B2 | 8/2003 | Moloudi et al. | 330/301 |
| 6,642,802 B2 | 11/2003 | Knowles et al. | 331/57 |
| 6,684,065 B2 | 1/2004 | Bult et al. | 455/252.1 |
| 6,696,898 B1 | 2/2004 | Ward et al. | 331/116 FE |
| 6,738,601 B1 | 5/2004 | Rofougaran et al. | 455/66.1 |
| 6,744,320 B2 | 6/2004 | Nguyen et al. | 330/254 |
| 6,759,904 B2 | 7/2004 | Behzad | 330/254 |
| 6,803,829 B2 | 10/2004 | Duncan et al. | 331/34 |
| 6,810,242 B2 | 10/2004 | Molnar et al. | 455/326 |
| 6,865,381 B2 | 3/2005 | Vorenkamp et al. | 455/307 |
| 6,879,816 B2 | 4/2005 | Bult et al. | 455/232.1 |
| 6,885,275 B1 | 4/2005 | Chang | 336/200 |
| 6,917,789 B1 | 7/2005 | Moloudi et al. | 455/78 |
| 6,920,311 B2 | 7/2005 | Rofougaran et al. | 455/66.1 |
| 6,922,555 B1 | 7/2005 | Mohindra | 455/314 |
| 6,950,957 B1 | 9/2005 | O'Leary | 713/401 |
| 6,961,546 B1 | 11/2005 | Rofougaran et al. | 455/118 |
| 6,963,110 B2 | 11/2005 | Woo et al. | 257/355 |

(Continued)

OTHER PUBLICATIONS

Wireless Comm. "What are Polyphase Filters?" May 16, 2005, p. 1-29.

*Primary Examiner*—Arnold Kinkead
(74) *Attorney, Agent, or Firm*—Schumaker & Sieffert, P.A.

(57) ABSTRACT

A radiation hard design for oscillator circuits and circuits having differential outputs is described. The design includes connecting or otherwise coupling outputs of these circuits to a passive polyphase filter. The passive polyphase filter provides four quadrature outputs that are free of glitches that may have occurred at the filter input.

16 Claims, 2 Drawing Sheets

U.S. PATENT DOCUMENTS

| | | | |
|---|---|---|---|
| 6,963,248 B2 | 11/2005 | Ward et al. | 331/18 |
| 6,968,167 B1 | 11/2005 | Wu et al. | 455/251.1 |
| 6,970,717 B2 | 11/2005 | Behrens et al. | 455/553.1 |
| 6,972,625 B2 | 12/2005 | Nguyen et al. | 330/254 |
| 6,975,838 B1 | 12/2005 | Rofougaran et al. | 455/20 |
| 6,985,035 B1 | 1/2006 | Khorramabadi | 330/253 |
| 6,987,966 B1 | 1/2006 | Wu et al. | 455/420 |
| 7,019,598 B2 | 3/2006 | Duncan et al. | 331/176 |
| 7,024,221 B2 | 4/2006 | Paulus et al. | 455/553.1 |
| 7,031,668 B2 | 4/2006 | Darabi et al. | 455/75 |
| 7,076,226 B2 | 7/2006 | Bult et al. | 455/252.1 |
| 7,082,293 B1 | 7/2006 | Rofougaran et al. | 455/260 |
| 7,092,043 B2 | 8/2006 | Vorenkamp et al. | 348/726 |
| 7,106,388 B2 | 9/2006 | Vorenkamp et al. | 348/726 |
| 7,109,781 B2 | 9/2006 | Vorenkamp et al. | 327/513 |
| 7,113,744 B1 | 9/2006 | Moloudi et al. | 455/20 |
| 7,115,952 B2 | 10/2006 | Woo et al. | 257/355 |
| 7,116,945 B2 | 10/2006 | Moloudi et al. | 455/78 |
| 7,130,579 B1 | 10/2006 | Rael et al. | 455/20 |
| 7,130,599 B2 * | 10/2006 | Persico et al. | 455/147 |
| 7,132,888 B2 | 11/2006 | Behzad | 330/254 |
| 7,136,622 B2 | 11/2006 | Rofougaran et al. | 455/20 |
| 7,139,540 B2 | 11/2006 | Wu et al. | 455/251.1 |
| 7,142,450 B2 | 11/2006 | Kozicki et al. | 365/174 |
| 7,302,248 B2 * | 11/2007 | Craninckx | 455/302 |
| 2007/0064470 A1 | 3/2007 | Takahashi et al. | 365/156 |
| 2007/0090886 A1 | 4/2007 | Kriz | 331/17 |
| 2007/0090887 A1 | 4/2007 | Seefeldt et al. | 331/17 |

* cited by examiner

RADIATION HARD OSCILLATOR AND DIFFERENTIAL CIRCUIT DESIGN

FIELD

The present invention relates generally to oscillator circuits and other circuits having a differential output, and more particularly, relates to a radiation hard design for these circuits.

BACKGROUND

Oscillator circuits are commonly used in electronic circuit designs to generate an oscillating output signal. These oscillator circuits may be found in clock generation circuits, phase-locked loop (PLL) circuits, timing circuits, and so on. For example, a ring oscillator, which generally includes an odd number of inverters connected in series, may be used as part of a PLL for clock and data recovery, frequency synthesis, and clock synchronization.

Differential oscillators are commonly used in order to suppress noise. For example, the differential oscillator may be based on a first Colpitts oscillator and a mirror image Colpitts oscillator that is coupled to the first Colpitts oscillator. The differential oscillator outputs differential output signals that are about 180 degrees out of phase. Colpitts oscillators are well-known in the art as are other differential oscillator designs.

With a differential scheme, any element in an electronic system that has to suppress noise is split into two branches. One of the branches contains the normal information, whereas the other branch contains the complementary (inverted) information. With proper matching of components, a highly symmetric design between the two branches can usually be obtained. Since the useful information is recovered or extracted from the difference in state between the two branches, common mode disturbances that affect both branches equally are ideally balanced out completely. Differential output stages are used in many conventional oscillator circuits and other circuit designs to provide balanced transmission properties with good noise immunity.

An oscillator circuit or other circuit providing a differential output may be used in applications in which the circuit is exposed to harsh environments, such as space and military applications. However, these circuits may be susceptible to Single Event Effects (SEE). SEE is a disturbance in an active semiconductor device caused by a single energetic particle. As semiconductor devices become smaller and smaller, transistor threshold voltages decrease. These lower thresholds reduce the charge per node needed to cause errors. As a result, the semiconductor devices become more and more susceptible to transient upsets.

One type of SEE is a single event upset (SEU). SEU is a radiation-induced error in a semiconductor device caused when charged particles lose energy by ionizing the medium through which they pass, leaving behind a wake of electron-hole pairs. The electron-hole pairs form a parasitic conduction path, which can cause a false transition on a node. The false transition, or glitch, can propagate through the semiconductor device and may ultimately result in the disturbance of a node containing state information, such as an output of a latch, register, or gate.

Typically, an SEU is caused by ionizing radiation components, such as neutrons, protons, and heavy ions. The ionizing radiation components are abundant in space and at commercial flight altitudes. Additionally, an SEU may be caused by alpha particles from the decay of trace concentrations of uranium and thorium present in some integrated circuit packaging. As another example, an SEU may be caused by detonating nuclear weapons. When a nuclear weapon is detonated, intense fluxes of gamma rays, x-rays, and other high energy particles are created, which may cause SEU.

For example, transistors in an oscillator circuit may be susceptible to SEU. As a result, the oscillator circuit may not provide a periodic output that can be reliably used as a clock signal or for other purposes. While others have used triple modular redundancy or other voting schemes to harden oscillator circuits against the effects of SEU, providing three oscillator circuits is typically prohibitive due to space and process variances.

Thus, it would be beneficial to harden an oscillator circuit or other differential output circuit so that these circuits may be used in applications that are susceptible to SEE without having to triplicate the circuit in a circuit design.

SUMMARY

A hardened oscillator circuit is described. The circuit includes a first oscillator circuit, a second oscillator circuit having a design substantially the same as the first oscillator circuit, and a filter that receives at least one input from the first and second oscillator circuits. The filter provides an output that is not impacted by a glitch on one of the filter inputs.

Preferably, the first and second oscillator circuits are differential oscillator circuits running in quadrature or ring oscillator circuits that provide four phases. However, the first and second oscillators may have other designs. Preferably, the filter is a passive polyphase filter.

A hardened circuit having differential outputs is also described. This hardened circuit includes a first circuit that provides a differential output, a second circuit having a design substantially the same as the first circuit, and a filter coupled to the differential output of the circuit. The filter provides an output that is not impacted by a glitch on one of the differential outputs. Preferably, the filter is a passive polyphase filter.

By running the oscillator outputs or the differential outputs through the filter, the filter negates any SEU effect seen in any one phase of an oscillator or differential output circuit. This as well as other aspects and advantages will become apparent to those of ordinary skill in the art by reading the following detailed description, with reference where appropriate to the accompanying drawings. Further, it is understood that this summary is merely an example and is not intended to limit the scope of the invention.

BRIEF DESCRIPTION OF THE DRAWINGS

Presently preferred embodiments are described below in conjunction with the appended drawing figures, wherein like reference numerals refer to like elements in the various figures, and wherein.

DETAILED DESCRIPTION

Figure 1:
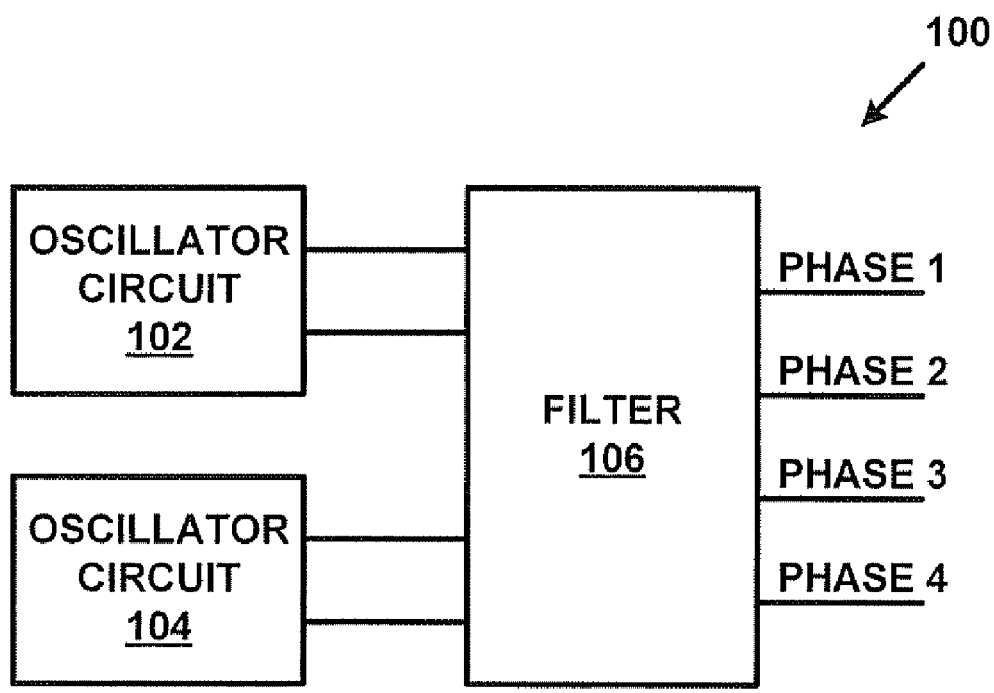
FIG. 1 is a block diagram of a hardened oscillator circuit, according to an example.

FIG. 1 is a block diagram of a hardened oscillator circuit 100. The circuit 100 includes two oscillator circuits 102, 104 and a filter 106. The outputs of the two oscillator circuits 102, 104 are connected or otherwise coupled to the inputs of the filter 106. As described in more detail below, the filter 106 provides an oscillator output that has been hardened against the effects of radiation-induced errors.

The first oscillator circuit 102 is an un-hardened oscillator circuit. The first oscillator circuit 102 may be duplicated providing the second oscillator circuit 104. The two oscillator circuits 102, 104 may have substantially the same design.

Preferably, the two oscillator circuits 102, 104 are differential oscillator circuits running in quadrature or a ring oscillator circuit that can provide four phases. However, other circuit designs may be used for the two oscillator circuits 102, 104. For example, the oscillator circuits may have any quad-phase oscillator design, such as a voltage controlled oscillator (VCO), a current controlled oscillator (CCO), or any other resonator or periodic output device producing similar waveforms in amplitude and frequency.

FIG. 1 depicts two outputs of each of the oscillator circuits 102, 104 connected to the filter 106. The two outputs indicate that the oscillator circuits 102, 104 are differential oscillator circuits. However, oscillator circuits having a single output or a differential oscillator with just one output may be connected to the filter 106. In the case of a differential oscillator circuit, one of the outputs may be unconnected to another device, otherwise referred to as "floating."

When a single oscillator output from each of the oscillator circuits 102, 104 is connected to the filter 106 the oscillators circuits 102, 104 may have a particular phase relationship. For example, when the output of the first oscillator circuit 102 has a phase of about 0°, the output of the second oscillator circuit 104 may be substantially 90°, 180°, or 270° depending on how the oscillator circuits 102, 104 are connected to the filter 106.

Preferably, the filter 106 is a passive polyphase filter. Generally, a passive polyphase filter comprises a multistage resistor and capacitor (RC) network that provides phase shifts, such as 90° phase differentials. The filter 106 is not limited to any particular passive polyphase filter design. Because the passive polyphase filter is typically formed using passive components (i.e., resistors and capacitors), the passive polyphase filter is unlikely to be impacted by SEU.

Figure 2:
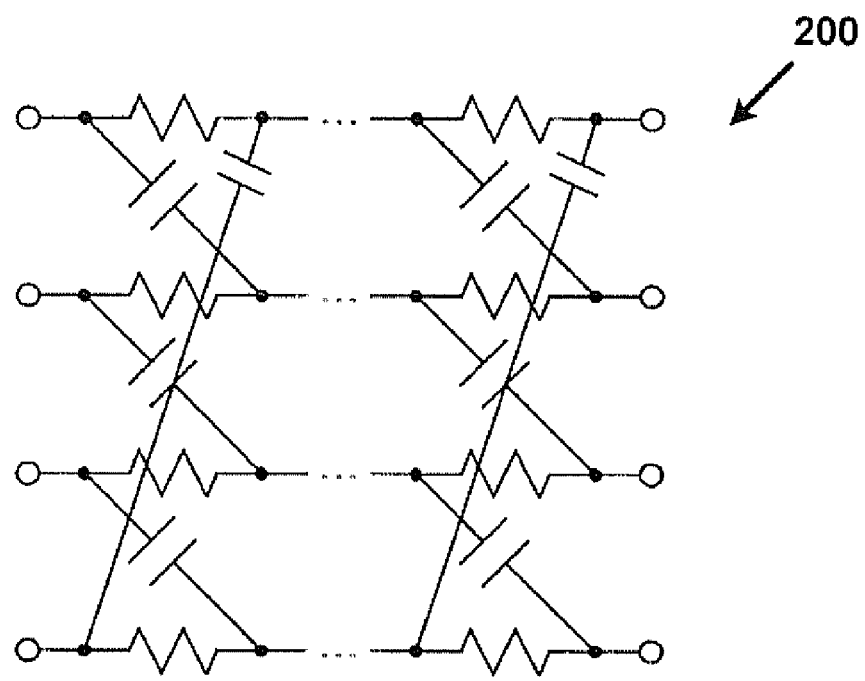
FIG. 2 is a circuit diagram of a passive polyphase filter for use in the hardened oscillator circuit depicted in FIG. 1, according to an example.

FIG. 2 depicts an example passive polyphase filter 200 that may be used for the filter 106. The filter 200 is a multistage passive polyphase filter with two stages shown and ellipses indicating that more than two stages may be in the filter 200. Multiple stages in the filter 200 may increase the frequency range over which the filter 200 operates. The number of stages used in filter 200 may depend on the application in which the filter 200 is used. The filter 200 is not limited to any particular number of stages.

Figure 3:
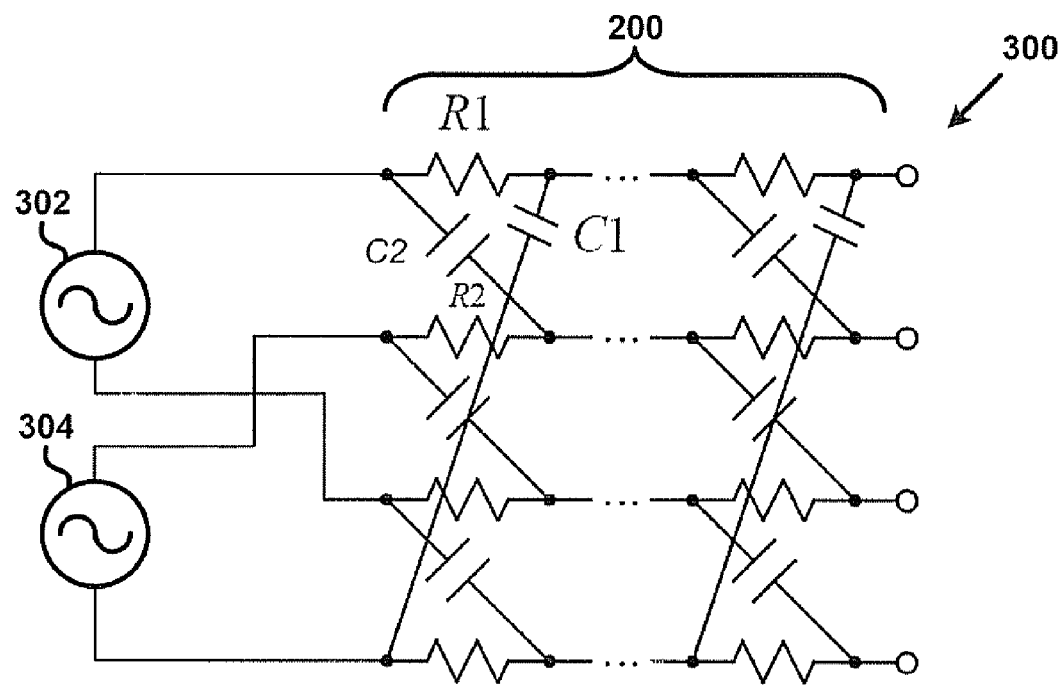
FIG. 3 is a circuit diagram of a hardened oscillator circuit, according to an example.

FIG. 3 is a circuit diagram of a hardened oscillator circuit 300. In this example, differential oscillators 302, 304 are operating in quadrature. The oscillators 302, 304 are connected to the inputs of the passive polyphase filter 200 depicted in FIG. 2. The filter 200 provides a four phase output that is sustained during short disruptions of one of the oscillators 302, 304.

By running the outputs of the oscillator circuits 102, 104 through the filter 106, the filter 106 negates any SEU effect seen in any one phase of an oscillator circuit 102, 104. This hardening effect may be the result of one oscillator's output being sufficient to maintain drive through the passive polyphase filter 106, producing the four quadrature outputs during the absence of the combined oscillator driving signals. During the SEU effect and subsequent oscillator recovery time, a continuous phase quadrature signal may be maintained with minimal jitter and amplitude variations. As a result, the filter 106 may harden the first oscillator circuit 102 against the effects of radiation with only a duplication of the oscillator circuit 104.

Figure 4:
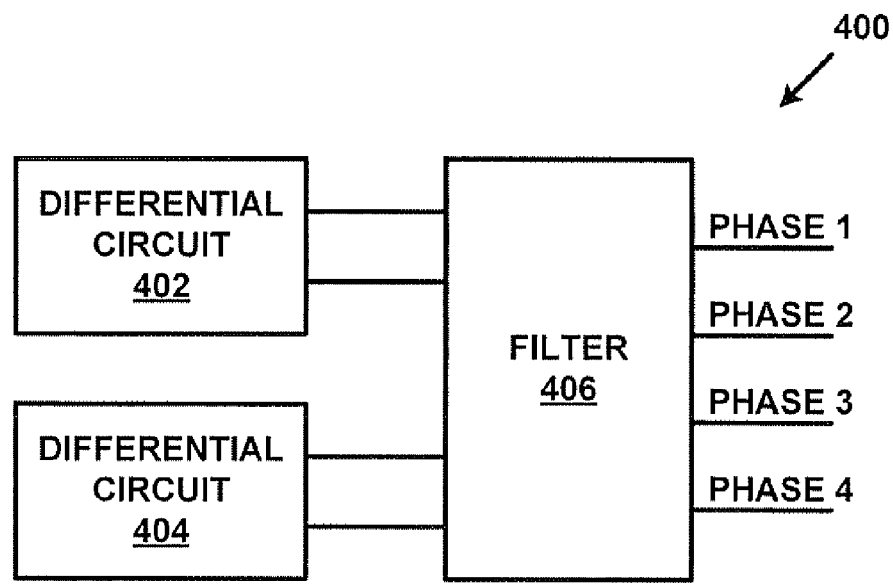
FIG. 4 is a block diagram of a hardened differential circuit, according to an example.

This hardening effect may also be used to harden other circuits that provide a differential output. FIG. 4 is a block diagram of a hardened differential circuit 400. The circuit 400 includes a first differential circuit 402, a second differential circuit 404 that is substantially the same as the first differential circuit 402, and a filter 406. The differential outputs of the differential circuits 402, 404 are connected or otherwise coupled to the inputs of the filter 406. The filter 406 provides four outputs in phase quadrature that has been hardened against the effects of radiation-induced errors.

The differential circuits 402, 404 may be any type of circuit that provides a differential output signal. For example, the circuits 402, 404 may be a differential output amplifier, a power amplifier, a line driver, a buffer, and so on. The differential circuits 402, 404 are designed to provide quadrature phase outputs of substantially 0°, 90°, 180°, and 270°. For example, the outputs of the first differential circuit 402 may be at 0° and 180°, while the outputs of the second differential circuit 404 may be at 90° and 270°.

Like the filter 106, the filter 406 is preferably a passive polyphase filter. For example, the filter 406 may be similar to the passive polyphase filter 200 depicted in FIG. 2. However, the hardened differential circuit 400 is not limited to any particular passive polyphase filter design.

By running the differential outputs of the circuits 402, 404 through the filter 406, the filter 406 negates any SEU effect seen in any one phase of the circuits 402, 404. This hardening effect may be the result of one circuit's output being sufficient to maintain drive through the filter 406. During the SEU effect and subsequent circuit recovery time, a continuous phase quadrature signal may be maintained with minimal jitter and amplitude variations. As a result, the filter 406 may harden the first differential circuit 402 against the effects of radiation with only a duplication of the differential circuit 404.

By adding a passive polyphase filter to the outputs of a pair of oscillators or differential circuits, the oscillator circuit or differential circuit may be hardened against the effects of radiation. As a result, these circuits may be used in applications that expose these circuits to radiation, such as space and military applications. Additionally, these circuits may be used without triple redundancy modulation or other voting techniques, which take more real estate in a circuit design than the techniques described herein.

It should be understood that the illustrated embodiments are examples only and should not be taken as limiting the scope of the present invention. The claims should not be read as limited to the described order or elements unless stated to that effect. Therefore, all embodiments that come within the scope and spirit of the following claims and equivalents thereto are claimed as the invention.

We claim:

1. A hardened oscillator circuit, comprising in combination:
   a first oscillator circuit;
   a second oscillator circuit having a design substantially the same as the first oscillator circuit, wherein the first and second oscillator circuits are one of either differential oscillator circuits running in quadrature or ring oscillator circuits that provide four phases; and
   a filter that receives at least one input from the first and second oscillator circuits, wherein the filter provides an output that is not impacted by a glitch on one of the inputs from the first and second oscillator circuits.

2. The circuit of claim 1, wherein the first oscillator circuit provides a first input to the filter and the second oscillator circuit provides a second input to the filter, wherein the second input is out of phase from the first input by a multiple of 90°.

3. The circuit of claim 2, wherein the first input is at a phase of 0° and the second input is at a phase selected from the group consisting of 90°, 180°, and 270°.

4. The circuit of claim 1, wherein the filter is a passive polyphase filter.

5. The circuit of claim 4, wherein the passive polyphase filter has multiple stages.

6. The circuit of claim 1, wherein the filter provides four quadrature outputs.

7. A hardened differential circuit, comprising in combination:
   a first circuit that provides a differential output;
   a second circuit having a design substantially the same as the first circuit; and
   a filter coupled to the differential outputs of the first and second circuits, wherein the filter provides an output that is not impacted by a glitch on one of the differential outputs.

8. The circuit of claim 7, wherein the first circuit provides a first differential input to the filter and the second circuit provides a second differential input to the filter, wherein the second input is out of phase from the first input by 90°.

9. The circuit of claim 8, wherein the first differential input provides signals at phases of 0° and 180°, and the second differential input provides signals at phases of 90° and 270°.

10. The circuit of claim 7, wherein the filter is a passive polyphase filter.

11. The circuit of claim 10, wherein the passive polyphase filter has multiple stages.

12. The circuit of claim 7, wherein the filter provides four quadrature outputs.

13. A method for hardening an oscillator circuit, comprising:
   providing a first oscillator circuit;
   providing a second oscillator circuit substantially the same as the first oscillator circuit, wherein the first and second oscillator circuits are one of either differential oscillator circuits running in quadrature or ring oscillator circuits that provide four phases; and
   connecting at least one output from the first and second oscillators to a filter, wherein the filter provides an output that is not impacted by a glitch on one of the inputs from the first and second oscillator circuits.

14. The method of claim 13, wherein the first oscillator circuit provides a first input to the filter and the second oscillator circuit provides a second input to the filter, wherein the second input is out of phase from the first input by a multiple of 90°.

15. The method of claim 13, wherein the filter is a passive polyphase filter.

16. The method of claim 13, wherein the filter provides four quadrature outputs.

* * * * *